United States Patent
Miki et al.

(10) Patent No.: US 7,601,979 B2
(45) Date of Patent: Oct. 13, 2009

(54) GALLIUM NITRIDE-BASED COMPOUND SEMICONDUCTOR MULTILAYER STRUCTURE AND PRODUCTION METHOD THEREOF

(75) Inventors: Hisayuki Miki, Ichihara (JP); Tetsuo Sakurai, Ichihara (JP); Hitoshi Takeda, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/586,849

(22) PCT Filed: Jan. 28, 2005

(86) PCT No.: PCT/JP2005/001642

§ 371 (c)(1),
(2), (4) Date: Jul. 20, 2006

(87) PCT Pub. No.: WO2005/074045

PCT Pub. Date: Aug. 11, 2005

(65) Prior Publication Data

US 2007/0164296 A1    Jul. 19, 2007

Related U.S. Application Data

(60) Provisional application No. 60/541,069, filed on Feb. 3, 2004.

(30) Foreign Application Priority Data

Jan. 29, 2004    (JP)    ............... 2004-021479

(51) Int. Cl.
*H01L 29/06* (2006.01)
(52) U.S. Cl. ............... 257/9; 257/14; 257/94; 257/103; 257/E27.135

(58) Field of Classification Search .......... 257/94, 257/103, 13, 79, 14
See application file for complete search history.

(56) References Cited

U.S. PATENT DOCUMENTS

| | | | |
|---|---|---|---|
| 5,088,100 A * | 2/1992 | Vassallo et al. | 372/45.01 |
| 5,434,426 A * | 7/1995 | Furuyama et al. | 250/551 |
| 5,486,490 A * | 1/1996 | Kakimoto | 438/33 |
| 6,121,634 A * | 9/2000 | Saito et al. | 257/86 |
| 6,222,871 B1 * | 4/2001 | Chang-Hasnain et al. | 372/96 |
| 6,881,983 B2 * | 4/2005 | Narayan et al. | 257/94 |
| 2003/0015104 A1 | 1/2003 | Parker | |

(Continued)

FOREIGN PATENT DOCUMENTS

JP    2001-28458 A    1/2001

(Continued)

*Primary Examiner*—Wai-Sing Louie
(74) *Attorney, Agent, or Firm*—Sughrue Mion, PLLC

(57) ABSTRACT

An object of the present invention is to provide a gallium nitride compound semiconductor multilayer structure useful for producing a gallium nitride compound semiconductor light-emitting device which operates at low voltage while maintaining a satisfactory light emission output. The inventive gallium nitride compound semiconductor multilayer structure comprises a substrate, and an n-type layer, an active layer, and a p-type layer formed on the substrate, the active layer being sandwiched by the n-type layer and the p-type layer, and the active layer comprising a thick portion and a thin portion, wherein the active layer has a flat lower surface (on the substrate side) and an uneven upper surface so as to form the thick portion and the thin portion.

37 Claims, 6 Drawing Sheets

U.S. PATENT DOCUMENTS

| | | |
|---|---|---|
| 2003/0151044 A1 | 8/2003 | Yamada |
| 2003/0160246 A1* | 8/2003 | Narayan et al. ............... 257/79 |
| 2003/0209704 A1 | 11/2003 | Yamada |
| 2004/0099858 A1* | 5/2004 | Lee ............................. 257/13 |
| 2005/0026399 A1* | 2/2005 | Chien et al. ................. 438/481 |

FOREIGN PATENT DOCUMENTS

JP    2003-289156 A    10/2003

* cited by examiner

GALLIUM NITRIDE-BASED COMPOUND SEMICONDUCTOR MULTILAYER STRUCTURE AND PRODUCTION METHOD THEREOF

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/541,069 filed on Feb. 3, 2004, pursuant to 35 U.S.C. §111(b).

TECHNICAL FIELD

The present invention relates to a gallium nitride compound semiconductor multilayer structure useful for producing a high-power light-emitting device which emits ultraviolet to blue light, or green light, and to a method for producing the semiconductor multilayer structure.

BACKGROUND ART

In recent years, gallium nitride compound semiconductors have become interesting as materials for producing light-emitting devices which emit light of short wavelength. Generally, a gallium nitride compound semiconductor is grown on a substrate made of an oxide crystal such as a sapphire single crystal, a silicon carbide single crystal, or a Group III-V compound single crystal, through a method such as metal-organic chemical vapor deposition (MOCVD), molecular-beam epitaxy (MBE), or hydride vapor phase epitaxy (HVPE).

At present, the crystal growth method that is most widely employed in the industry includes growing a semiconductor crystal on a substrate such as sapphire, SiC, GaN, or AlN, through metal-organic chemical vapor deposition (MOCVD). Specifically, an n-type layer, an active layer, and a p-type layer are grown on the aforementioned substrate placed in a reactor tube, by use of a Group III organometallic compound and a Group V source gas at about 700° C. to about 1,200° C.

After growth of the above layers, a negative electrode is formed on the substrate or the n-type layer, and a positive electrode is formed on the p-type layer, whereby a light-emitting device is fabricated.

Conventionally, such an active layer is formed from InGaN whose composition is controlled so as to modulate the light emission wavelength. The active layer is sandwiched by layers having a bandgap higher than that of InGaN, thereby forming a double-hetero structure, or is incorporated into a multiple quantum well structure on the basis of the quantum well effect.

In a gallium nitride compound semiconductor light-emitting device having active layers included in a multiple quantum well structure, when the thickness of a well layer is adjusted to 20 to 30 Å, satisfactory output is attained, but a problematically high operation voltage is required. In contrast, when the thickness of the well layer is 20 Å or less, operation voltage is lowered, but output is poor.

There has been also proposed a quantum dot structure in which an active layer in the form of a dot pattern is formed as described below.

For example, Japanese Patent Application Laid-Open (kokai) Nos. 10-79501 and 11-354839 disclose light-emitting devices having an active layer of a quantum dot structure. The quantum dot structure is formed through an anti-surfactant effect. However, the above-proposed quantum dot structure has a problem. That is, since the total area of dots (light-emitting dots) is excessively small with respect to the area where current flows, overall emission output with respect to input current is lowered, even though the emission efficiency of each light-emitting dot is enhanced. These patent documents do not stipulate the area covered with dots. However, the area that is not covered with dots is considerably greater than the area covered with dots, as calculated from the dot size and preferred dot density described in the specifications.

In addition, there has been proposed a quantum box structure including a light-emitting box having an area greater than that of a light-emitting dot.

For example, Japanese Patent Application Laid-Open (kokai) No. 2001-68733 discloses an In-containing quantum box structure which is formed by annealing a formed quantum well structure in hydrogen so as to sublimate the well layer. The dimensions of each light-emitting box are preferably as follows: 0.5 nm≦height≦50 nm and 0.5 nm≦width≦200 nm, and a light-emitting box (height: 6 nm, width: 40 nm) is fabricated in a Working Example. Although the light-emitting box density is not stipulated, the area which is not covered with light-emitting boxes is greater than or equal to the area which is covered with light-emitting boxes, as shown in an attached drawing.

Briefly, each of the structures based on the aforementioned techniques do not include quantum dots or quantum boxes in the area on which quantum dots or boxes are not provided. In addition, the area which is covered with quantum boxes or dots is very small and, in contrast, the area which is not covered with quantum boxes or dots is larger.

In such a structure in which the area that is covered with light-emitting boxes or dots is very small and no light-emitting elements are provided in the area that is not covered with quantum boxes or dots, the operation voltage can be lowered, but emission output is problematically reduced. Thus, such a structure cannot be used in practice.

Japanese Patent Application Laid-Open (kokai) No. 2001-68733 also discloses that a quantum box structure is fabricated by forming a conventional quantum well structure and annealing the structure in hydrogen, thereby decomposing an InGaN crystal provided on through-hole dislocations. However, annealing a quantum well structure in hydrogen induces a release of In from a portion to serve as a quantum box structure, thereby blue-shifting the emission wavelength, which is not preferred.

Also, in US Patent Application Publication No. US2003/0160229A1, a quantum well structure, in which a well layer has a thickness which changes periodically, is disclosed. The well layer has depressions and protrusions in upper and lower surfaces, which means that an upper surface of a barrier layer, which fills up the depressions of the well layer, is not flat. In such structure, although the operation voltage can be lowered, emission output is reduced.

DISCLOSURE OF INVENTION

An object of the present invention is to provide a gallium nitride compound semiconductor multilayer structure useful for producing a gallium nitride compound semiconductor light-emitting device which operates at low voltage while maintaining satisfactory light emission output.

Another object of the invention is to provide a method for forming an active layer which prevents blue-shifting of emitted light.

The present invention provides the following.

(1) A gallium nitride compound semiconductor multilayer structure comprising a substrate, and an n-type layer, an active layer, and a p-type layer formed on the substrate, the active layer being sandwiched by the n-type layer and the p-type layer, and the active layer comprising a thick portion and a thin portion, wherein the active layer has a flat lower surface (on the substrate side) and an uneven upper surface so as to form the thick portion and the thin portion.

(2) A gallium nitride compound semiconductor multilayer structure according to (1) above, wherein the active layer contains In.

(3) A gallium nitride compound semiconductor multilayer structure according to (2) above, wherein the upper surface of the active layer is covered with a thin layer not containing In.

(4) A gallium nitride compound semiconductor multilayer structure according to any one of (1) to (3) above, wherein the thick portion has a thickness of 15 Å to 50 Å.

(5) A gallium nitride compound semiconductor multilayer structure according to (4) above, wherein the thick portion has a thickness of 15 Å to 30 Å.

(6) A gallium nitride compound semiconductor multilayer structure according to any one of (1) to (5) above, wherein the thick portion has an arithmetic mean width, as measured in a cross-section of the multilayer structure, of 10 nm or more.

(7) A gallium nitride compound semiconductor multilayer structure according to (6) above, wherein the thick portion has a width, as measured in a cross-section of the multilayer structure, of 100 nm or more.

(8) A gallium nitride compound semiconductor multilayer structure according to any one of (1) to (7) above, wherein the thin portion has a thickness of 15 Å or less.

(9) A gallium nitride compound semiconductor multilayer structure according to any one of (1) to (8) above, wherein the thin portion has an arithmetic mean width, as measured in a cross-section of the multilayer structure, of 100 nm or less.

(10) A gallium nitride compound semiconductor multilayer structure according to (9) above, wherein the thin portion has a width, as measured in a cross-section of the multilayer structure, of 50 nm or less.

(11) A gallium nitride compound semiconductor multilayer structure according to any one of (1) to (10) above, wherein the difference in thickness between the thick portion and the thin portion falls within a range of 10 Å to 30 Å.

(12) A gallium nitride compound semiconductor multilayer structure according to any one of (1) to (11) above, wherein the thick portion has an area accounting for 30% or more the entire area of the active layer.

(13) A gallium nitride compound semiconductor multilayer structure according to (12) above, wherein the thick portion has an area accounting for 50% or more the entire area of the active layer.

(14) A gallium nitride compound semiconductor multilayer structure according to any one of (1) to (13) above, wherein the active layer is at least one well layer in a multiple quantum well structure.

(15) A gallium nitride compound semiconductor multilayer structure according to (14) above, wherein the multiple quantum well structure is repeatedly stacked 3 to 10 times.

(16) A gallium nitride compound semiconductor multilayer structure according to (15) above, wherein the multiple quantum well structure is repeatedly stacked 3 to 6 times.

(17) A gallium nitride compound semiconductor multilayer structure according to any one of (14) to (16) above, wherein the multiple quantum well structure has a barrier layer formed of a gallium nitride compound semiconductor selected from GaN, AlGaN, and InGaN which has an In content lower than that of the InGaN forming the active layer.

(18) A gallium nitride compound semiconductor multilayer structure according to (17) above, wherein the barrier layer is formed of GaN.

(19) A gallium nitride compound semiconductor multilayer structure according to (17) or (18) above, wherein the barrier layer has a thickness of 70 Å to 500 Å.

(20) A gallium nitride compound semiconductor multilayer structure according to (19) above, wherein the barrier layer has a thickness of 160 Å or more.

(21) A gallium nitride compound semiconductor light-emitting device, wherein the device has a negative electrode and a positive electrode, the negative electrode and the positive electrode being provided on the n-type layer and the p-type layer of a gallium nitride compound semiconductor multilayer structure according to any one of (1) to (20) above, respectively.

(22) A gallium nitride compound semiconductor light-emitting device according to (21) above, which has a flip-chip-type device structure.

(23) A gallium nitride compound semiconductor light-emitting device according to (22) above, wherein the positive electrode has a reflection-type structure.

(24) A method for producing a gallium nitride compound semiconductor multilayer structure including a substrate, and an n-type layer, an active layer, and a p-type layer formed on the substrate, the active layer being sandwiched by the n-type layer and the p-type layer and comprising a thick portion and a thin portion, wherein the method comprises a step of forming the active layer, which step includes a step of growing a gallium nitride compound semiconductor and a step of decomposing or sublimating a portion of the gallium nitride compound semiconductor.

(25) A method for producing a gallium nitride compound semiconductor multilayer structure as described in (24) above, wherein the active layer contains In.

(26) A method for producing a gallium nitride compound semiconductor multilayer structure according to (25) above, wherein the active layer is grown by continuously supplying a nitrogen source and a Group III metal source containing In and Ga and, subsequently, a thin layer not containing In is formed on a surface of the active layer by stopping the feeding of the In metal source.

(27) A method for producing a gallium nitride compound semiconductor multilayer structure according to any one of (24) to (26) above, wherein the step of growing is performed at a substrate temperature of T1 and the step of decomposing or sublimating is performed at a substrate temperature of T2, wherein T1 and T2 satisfy the relationship: $T1 \leq T2$.

(28) A method for producing a gallium nitride compound semiconductor multilayer structure according to (27) above, wherein T1 falls within a range of 650 to 900° C.

(29) A method for producing a gallium nitride compound semiconductor multilayer structure according to (28) above, wherein T2 falls within a range of 700 to 1,000° C.

(30) A method for producing a gallium nitride compound semiconductor multilayer structure according to any one of (24) to (29) above, wherein the step of growing is performed in an atmosphere containing a nitrogen source and a Group III metal source and the step of decomposing or sublimating is performed in an atmosphere containing a nitrogen source but not containing a Group III metal source.

(31) A method for producing a gallium nitride compound semiconductor multilayer structure according to (30) above, wherein the step of decomposing or sublimating is performed while the substrate temperature T1 is elevated to T2.

(32) A method for producing a gallium nitride compound semiconductor multilayer structure according to (31) above, wherein the substrate temperature T1 is elevated to T2 at a temperature elevation rate of 1° C./min to 100° C./min.

(33) A method for producing a gallium nitride compound semiconductor multilayer structure according to (32) above, wherein the temperature elevation rate is 5° C./min to 50° C./min.

(34) A method for producing a gallium nitride compound semiconductor multilayer structure according to any one of (31) to (33) above, wherein the substrate temperature T1 is elevated to T2 over 30 seconds to 10 minutes.

(35) A method for producing a gallium nitride compound semiconductor multilayer structure according to (34) above, wherein the substrate temperature T1 is elevated to T2 over one minute to five minutes.

(36) A method for producing a gallium nitride compound semiconductor multilayer structure according to any one of (27) to (35) above, wherein the active layer is at least one well layer in a multiple quantum well structure, and at least one barrier layer in the multiple quantum well structure is grown at T2, followed by lowering the substrate temperature to T3 at which further growth is performed.

(37) A method for producing a gallium nitride compound semiconductor multilayer structure according to (36) above, wherein T3 is equal to T1.

According to the gist of the present invention; i.e., the active layer having a flat lower surface (on the substrate side) and an uneven upper surface so as to form the thick portion and the thin portion, a gallium nitride compound semiconductor light-emitting device which maintains satisfactory output and exhibits a reduced operation voltage can be produced.

Through formation of the thin portion of the active layer in the presence of a nitrogen source, blue-shifting of the light emitted from the active layer can be prevented.

BEST MODES FOR CARRYING OUT THE INVENTION

The n-type layer, active layer, and p-type layer of a gallium nitride compound semiconductor light-emitting device are widely known to be formed from a variety of gallium nitride compound semiconductors represented by formula: $Al_xIn_yGa_{1-x-y}N$ ($0 \leq x<1$; $0 \leq y<1$; $0 \leq x+y<1$). No particular limitation is imposed on the gallium nitride compound semiconductor for forming the n-type layer, active layer, and p-type layer employed in the present invention, and a variety of gallium nitride compound semiconductors represented by formula: $Al_xIn_yGa_{1-x-y}N$ ($0 \leq x<1$; $0 \leq y<1$; $0 \leq x+y<1$) may also be employed.

No particular limitation is imposed on the type of the substrate, and there may be employed conventionally known substrate species such as sapphire, SiC, GaP, GaAs, Si, ZnO, and GaN.

In order to form a gallium nitride compound semiconductor on any of the above substrates (excepting a GaN substrate) which are not theoretically lattice-matched with the gallium nitride compound, a low-temperature buffer method (disclosed in, for example, Japanese Patent 3026087 and Japanese Patent Application Laid-Open (kokai) No. 4-297023) and a lattice-mismatch crystal epitaxial growth technique (disclosed in, for example, Japanese Patent Application Laid-Open (kokai) No. 2003-243302), which is called "seeding process (SP)," may be employed. Among these methods, from the viewpoint of productivity and other factors, the SP method is a particularly advantageous lattice-mismatch crystal epitaxial growth technique which can produce AlN crystal film at the high temperature that enables formation of GaN crystals.

When a lattice-mismatch crystal epitaxial growth technique such as a low-temperature buffer method or an SP method is employed, the gallium nitride compound semiconductor, which is formed on the buffer layer as an undercoat layer, is preferably GaN which is undoped or lightly doped (dopant concentration is about $5 \times 10^{17}$ cm$^{-3}$). The undercoat layer preferably has a thickness of 1 to 20 μm, more preferably 5 to 15 μm.

In the present invention, the active layer is formed from a thick portion and a thin portion. As used herein, the term "thick portion" refers to a portion having a thickness not less than an average thickness of the active layer, and the term "thin portion" refers to a portion having a thickness less than an average thickness of the active layer. The term "average thickness" is the arithmetic mean of the largest thickness and the smallest thickness. When the thin portion includes an area that is not covered with an active layer or has a very thin active layer, the thick portion refers to a portion having a thickness not less than ½ the largest thickness of the active layer, and the thin portion refers to a portion having a thickness less than ½ the largest thickness of the active layer.

Figure 1:
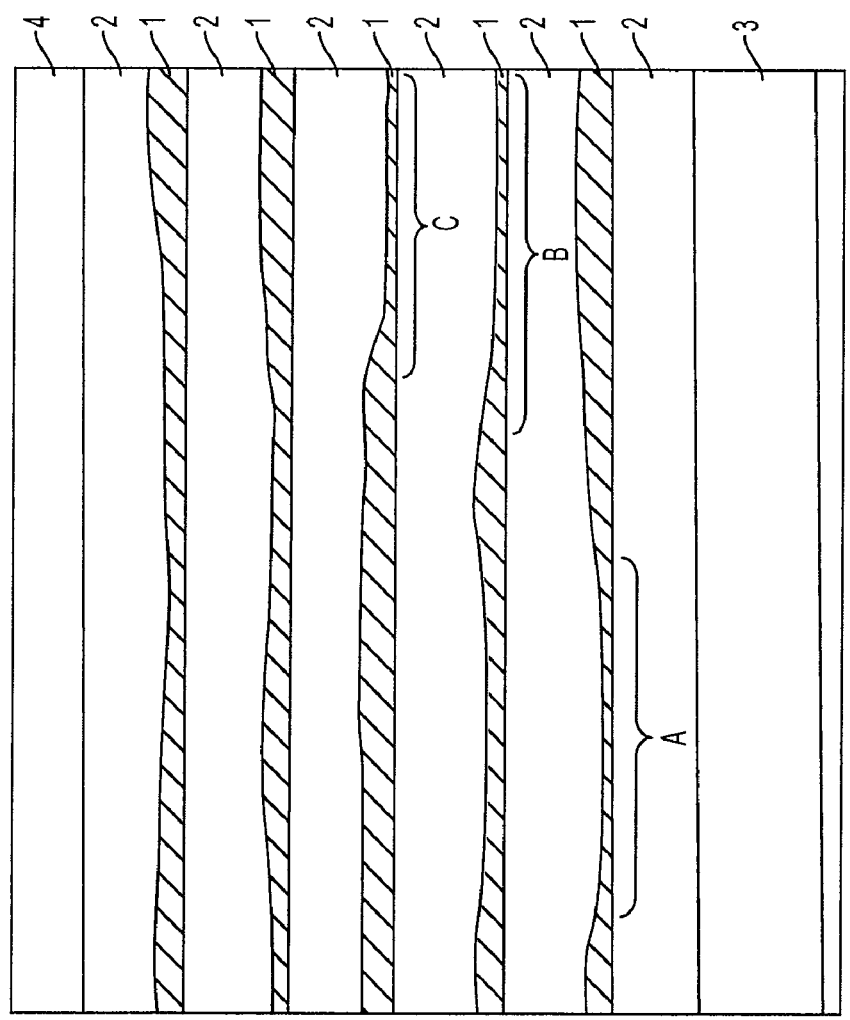
FIG. 1 is an exemplary cross-section TEM photograph of the gallium nitride compound semiconductor multilayer structure fabricated in Example 1.
Figure 2:
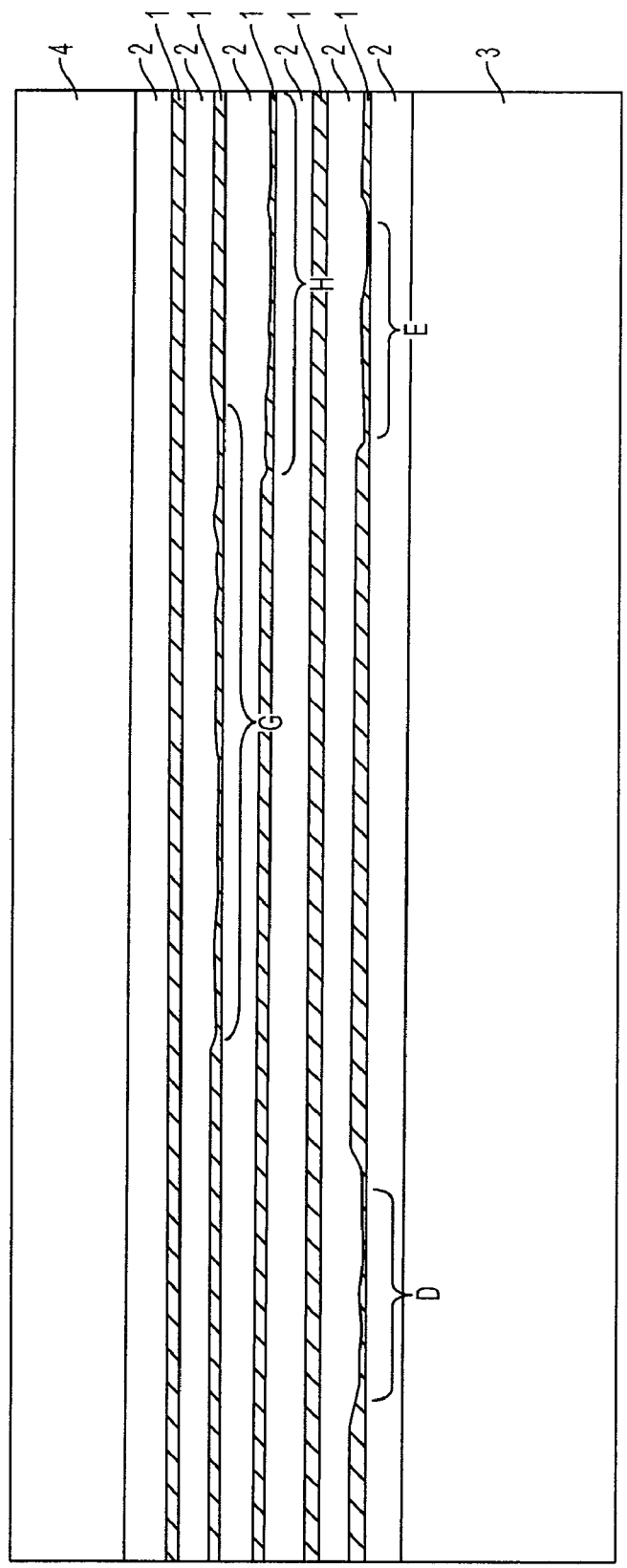
FIG. 2 is another exemplary cross-section TEM photograph of the gallium nitride compound semiconductor multilayer structure fabricated in Example 1.

The thick portion and the thin portion can be determined visually and quantitatively from a TEM cross-section photograph of a gallium nitride compound semiconductor. For example, from a TEM cross-section photograph of the compound semiconductor at a magnification of 500,000 to 2,000,000, the thickness and width of the thick portion or the thin portion can be determined. FIG. 1 shows a TEM cross-section photograph of a semiconductor sample fabricated in Example 1 at a magnification of 2,000,000. In FIG. 1, reference numeral 1 denotes an active layer (well layer), and each of A, B, and C denotes a thin portion. Reference numerals 2, 3 and 4 denote a barrier layer, n-type cladding layer and p-type cladding layer, respectively. The width and thickness of a thick portion or a thin portion can be calculated by use of the magnification. FIG. 2 shows a TEM cross-section photograph of the same sample 1 at a magnification of 500,000. In FIG. 2, reference numeral 1 denotes an active layer (well layer), and each of D, E, F, and G denotes a thin portion. Reference numerals 2, 3 and 4 denote a barrier layer, n-type cladding layer and p-type cladding layer, respectively. The width and thickness of a thick portion or a thin portion can be calculated by use of the magnification.

The thickness or the width of a thick portion or a thin portion is an arithmetically averaged value obtained in a plurality of observation fields for measurement in a TEM cross-section photograph (e.g., observed in 10 fields, adjacent fields being spaced at a pitch of 10 μm).

The active layer preferably has a virtually flat lower surface (on the substrate side) and an uneven upper surface, which forms depressions and protrusions, so as to form the thick portion and the thin portion. Through employment of such a structure, a drop in emission intensity and deterioration due to aging can be prevented.

As used herein, the expression "flat" refers to the case where a difference of height between a depressed portion and a protruded portion, which is observed from aforementioned TEM cross-section photograph, is, for example, 1 nm or less. It is preferable that the difference is 0.5 nm or less, and it is more preferable that depressions and protrusions are scarcely visible.

Also, when the difference at the lower surface is ⅕ or less in contrast to that at the upper surface, a layer which is adjacent to the substrate side of the active layer (for example, a barrier in case of a multiple quantum well structure) has an excellent crystallinity and characteristic is improved. It is more preferable that the difference at the lower surface is 1/10 or less in contrast to that at the upper surface. It is most preferable that depressions and protrusions are scarcely visible at the lower surface.

The thick portion preferably has a thickness of about 15 Å to about 50 Å. When the thickness of the thick portion falls outside the range, emission output is lowered. More preferably, the thickness is 15 Å to 30 Å. The width of the thick portion is preferably 10 to 5,000 nm, more preferably 100 to 1,000 nm.

The active layer may include a thin portion having a thickness of 0. In other words, the active layer may include an area that is not covered with an active layer. However, such an area is preferably narrow, because the absence of an active layer causes lowering of emission output. Thus, the area preferably accounts for 30% or less the entire area of the active layer, more preferably 20% or less, particularly preferably 10% or less.

The thin portion has a width of 1 to 100 nm, more preferably 5 to 50 nm.

The difference in thickness between the thick portion and the thin portion preferably falls within a range of about 10 to about 30 Å. The thickness of the thin portion is preferably 15 Å or less.

In the area where current flows, the area that is covered with the thick portion preferably accounts for 30 to 90% the entire active layer. When the area falls within the range, lowering of operation voltage and maintaining output can be attained. More preferably, the area that is covered with the thick portion is greater than the area that is covered with the thin portion (i.e., accounting for 50% or more the entire active layer).

The active layer may have a single quantum well structure being formed of a single layer. However, the active layer preferably has a multiple quantum well structure in which a well layer serving as an active layer and a barrier layer are alternatingly stacked repeatedly, from the viewpoint of enhancement of emission output. The repetition of stacking is preferably about 3 to about 10 times, more preferably about 3 to about 6 times. All the well layers (active layers) included in the multiple quantum well structure do not necessarily have a thick portion and thin portion, and the dimensions and area proportion of each of the thick portions and the thin portions may vary layer by layer. In the specification, when a multiple quantum well structure is employed, the entirety of the well layers (active layers) in combination with the barrier layers are referred to as a light-emitting layer.

In a preferred mode, a barrier layer fills up the thin portion of a well layer, and has a flat upper surface. According to this preferred mode, the lower surface of the subsequently stacked well layer becomes flat.

The barrier layer preferably has a thickness of 70 Å or more, more preferably 140 Å or more. When the barrier layer is excessively thin, planarization of the upper surface of the barrier layer cannot be attained, leading to lowering of emission efficiency and deterioration in characteristics due to aging, whereas when the barrier layer is excessively thick, operation voltage increases and emission becomes weak. Therefore, the barrier layer preferably has a thickness of 500 Å or less.

The active layer is preferably formed of a gallium nitride compound semiconductor containing In, as the In-containing gallium nitride compound semiconductor is of a crystal system for readily attaining a structure having a thick portion and a thin portion through the below-mentioned method. In addition, the In-containing gallium nitride compound semiconductor can emit high-intensity light in a blue light wavelength region.

When the active layer is formed of an In-containing gallium nitride compound semiconductor, the upper surface of the active layer is preferably covered with a thin layer containing no In. By virtue of the thin layer, decomposition/sublimation of In contained in the active layer can be suppressed, whereby emission wavelength can be consistently controlled, which is preferred.

The active layer may be doped with an impurity element. The dopant is preferably Si or Ge, which are known to serve as donors, for the purpose of enhancement of emission intensity. The dopant concentration is preferably about $1 \times 10^{17}$ cm$^{-3}$ to about $1 \times 10^{18}$ cm$^{-3}$. When the amount is in excess of the upper limit of the range, emission intensity decreases.

In the case where the multiple quantum well structure is employed, the barrier layer may be formed of GaN, AlGaN, and InGaN which has an In content lower than that of InGaN forming a well layer (active layer). Among them, GaN is preferred.

The n-type layer generally has a thickness of about 1 to about 10 μm, preferably about 2 to about 5 μm. The n-type layer is formed of an n-type contact layer for forming a negative electrode and an n-type cladding layer which has a bandgap larger than that of an active layer and which is in contact with the active layer. The n-type contact layer may also serve as the n-type cladding layer. The n-type contact layer is preferably doped with Si or Ge at high concentration. The thus-doped n-type layer preferably has a carrier concentration which is controlled to about $5 \times 10^{18}$ cm$^{-3}$ to about $2 \times 10^{19}$ cm$^{-3}$.

The n-type cladding layer may be formed from a semiconductor such as AlGaN, GaN, or InGaN. Needless to say, when InGaN is employed, the InGaN preferably has such a composition as to have a bandgap greater than that of InGaN forming the active layer. The carrier concentration of the n-type cladding layer may be equal to or greater or smaller than that of the n-type contact layer. The n-type cladding layer preferably has a surface having high flatness by appropriately regulating growth conditions including growth rate, growth temperature, growth pressure, and dopant concentration, so as to attain high crystallinity of the active layer formed thereon.

The n-type cladding layer may be formed by alternatingly stacking layers repeatedly, each layer having a specific composition and lattice constants. In this case, in addition to the composition, the amount of dopant, film thickness, etc. of the layer stacked may be modified.

The p-type layer generally has a thickness of 0.01 to 1 μm and is formed of a p-type cladding layer which is in contact with the active layer and a p-type contact layer for forming a positive electrode. The p-type cladding layer may also serve as the p-type contact layer. The p-type cladding layer is formed from a semiconductor such as GaN or AlGaN and doped with Mg serving as a p-type dopant. In order to prevent overflow of electrons, the p-type cladding layer is preferably formed from a material having a bandgap greater than that of the material for forming the active layer. Furthermore, in order to effectively inject carries to the active layer, the p-type cladding layer preferably has high carrier concentration.

Similar to the n-type cladding layer, the p-type cladding layer may be formed by alternatingly stacking layers repeatedly, each layer having a specific composition and lattice constants. In this case, in addition to the composition, the amount of dopant, film thickness, etc. of the stacked layer may be modified.

The p-type contact layer may be formed from a semiconductor such as GaN, AlGaN, or InGaN, and is doped with Mg serving as an impurity element. When removed from a reactor, the as-removed Mg-doped gallium nitride semiconductor compound semiconductor generally exhibits high electric resistance. However, the Mg-doped compound semiconductor exhibits p-type conductivity through activation such as annealing, electron-beam irradiation, or microwave irradiation.

The p-type contact layer may be formed from boron phosphide doped with a p-type impurity element, which exhibits p-type conductivity even though the aforementioned treatment for attaining p-type conductivity is not performed.

No particular limitation is imposed on the method for growing the gallium nitride compound semiconductor for forming the aforementioned n-type layer, active layer, and p-type layer, and any of widely known methods such as MBE, MOCVD, and HVPE may be employed under widely known conditions. Of these, MOCVD is preferred.

Regarding sources for forming the semiconductor, ammonia, hydrazine, an azide, or a similar compound may be used as a nitrogen source. Examples of the Group III organometallic source which may be employed in the invention include trimethylgallium (TMGa), triethylgallium (TEGa), trimethylindium (TMIn), and trimethylaluminum (TMAl). Examples of employable dopant sources include silane, disilane, germane, organic germanium sources, and biscyclopentadienylmagnesium ($Cp_2Mg$). Nitrogen or hydrogen may be employed as a carrier gas.

Preferably, the active layer including a thick potion and a thin portion is formed by growing a gallium nitride compound semiconductor and decomposing or sublimating a portion of the grown semiconductor. An In-containing gallium nitride compound semiconductor is preferred, because the semiconductor is readily decomposed or sublimated.

The In-containing active layer is preferably grown at a substrate temperature of 650 to 900° C. When the substrate temperature is lower than 650° C., an active layer of high crystallinity cannot be formed, whereas when the substrate temperature is higher than 900° C., the amount of In incorporated into the active layer decreases, thereby failing to fabricating a light-emitting device which emits light of intended wavelength.

As described above, when the active layer contains In, a thin layer containing no In is preferably formed on the surface of the active layer. In this case, after completion of growth of an In-containing gallium nitride compound semiconductor, a gallium nitride compound semiconductor is grown at the same substrate temperature while the supply of the In source is stopped.

After the In-containing gallium nitride compound semiconductor has been grown to a predetermined thickness by continuously supplying a Group III metal (containing In) source and a nitrogen source, supply of the Group III metal source is stopped. The substrate temperature is maintained or elevated under the above conditions, thereby decomposing or sublimating a portion of the compound semiconductor. The carrier gas is preferably nitrogen. Decomposition or sublimation is preferably performed, when the substrate temperature has been elevated from the above growth temperature to 700 to 1,000° C. or while the substrate temperature is elevated.

In the case where the active layer has a multiple quantum well structure, the barrier layer is preferably grown at a substrate temperature higher than that employed for the growth of the well layer (active layer). The substrate temperature is preferably 700 to 1,000° C.

When the temperature at which the well layer is grown is represented by T1 and the temperature at which the barrier layer is grown is represented by T2, T1 and T2 satisfy the relationship: T1≦T2. During temperature elevation after growth of the well layer from T1 to T2, supply of the Group III source is stopped while the nitrogen source and a nitrogen-containing carrier gas are supplied continuously, whereby a thick portion and a thin portion are effectively formed in the well layer. During the course of the above procedure, a change of the carrier gas is not needed. If the carrier gas is changed to hydrogen, the wavelength of emitted light is blue-shifted. As such variation in wavelength is difficult to control reliably, the variation reduces the device productivity.

The rate of temperature elevation from T1 to T2 is preferably about 1 to about 100° C./min, more preferably about 5 to about 50° C./min. The time required for temperature elevation from T1 to T2 is preferably about 30 sec to about 10 min, more preferably about 1 min to about 5 min.

The growth of the barrier layer may include a plurality of steps which are performed at different growth temperatures. For example, a barrier layer having a predetermined thickness is formed at T2 on a well layer having a thick portion and a thin portion, followed by forming thereon another barrier layer at a growth temperature T3. When T3 is lower than T2, deterioration of characteristics caused by aging can be prevented, which is preferred. T3 may be equal to T1.

Negative electrodes of a variety of compositions and structures have been widely known, and no particular limitation is imposed on the negative electrode which may be employed in the present invention. Examples of employable contact materials for the negative electrode which is to be in contact with an n-type contact layer include Al, Ti, Ni, Au, Cr, W, and V. Needless to say, the negative electrode may have a multilayer structure in its entirety, thereby imparting the electrode with a bonding property and other properties.

Positive electrodes of a variety of compositions and structures have been widely known, and no particular limitation is imposed on the positive electrode which may be employed in the present invention.

Examples of light-permeable positive electrode materials include Pt, Pd, Au, Cr, Ni, Cu, and Co. Through partial oxidation of the positive electrode, light permeability is known to be enhanced. Examples of employable reflection-type positive electrode materials include the aforementioned materials, Rh, Ag, and Al.

The positive electrode may be formed through a method such as sputtering or vacuum vapor deposition. Particularly when sputtering is employed under appropriately controlled sputtering conditions, ohmic contact can be established even though the electrode film is not annealed after formation of the film, which is preferred.

The light-emitting device may have a flip-chip-type structure including a reflection-type positive electrode or a face-up-type structure including an light-permeable positive electrode or a lattice-like or comb-like positive electrode.

According to the active layer of the present invention including a thick portion and a thin portion, an interface between the active layer and a p-type layer composed of a material different from that of the active layer (in the case of multiple quantum well structure, interface between the well layer (active layer) and a barrier layer) in a boundary area between the thick portion and the thin portion is slanted to the substrate surface. Therefore, the amount of light extracted in the direction normal to the substrate surface increases. Particularly when the light-emitting device has a flip-chip-type structure including a reflection-type electrode, emission intensity is further enhanced.

EXAMPLES

The present invention will be described in more detail by way of examples, which should not be construed as limiting the invention.

Example 1

Figure 3:
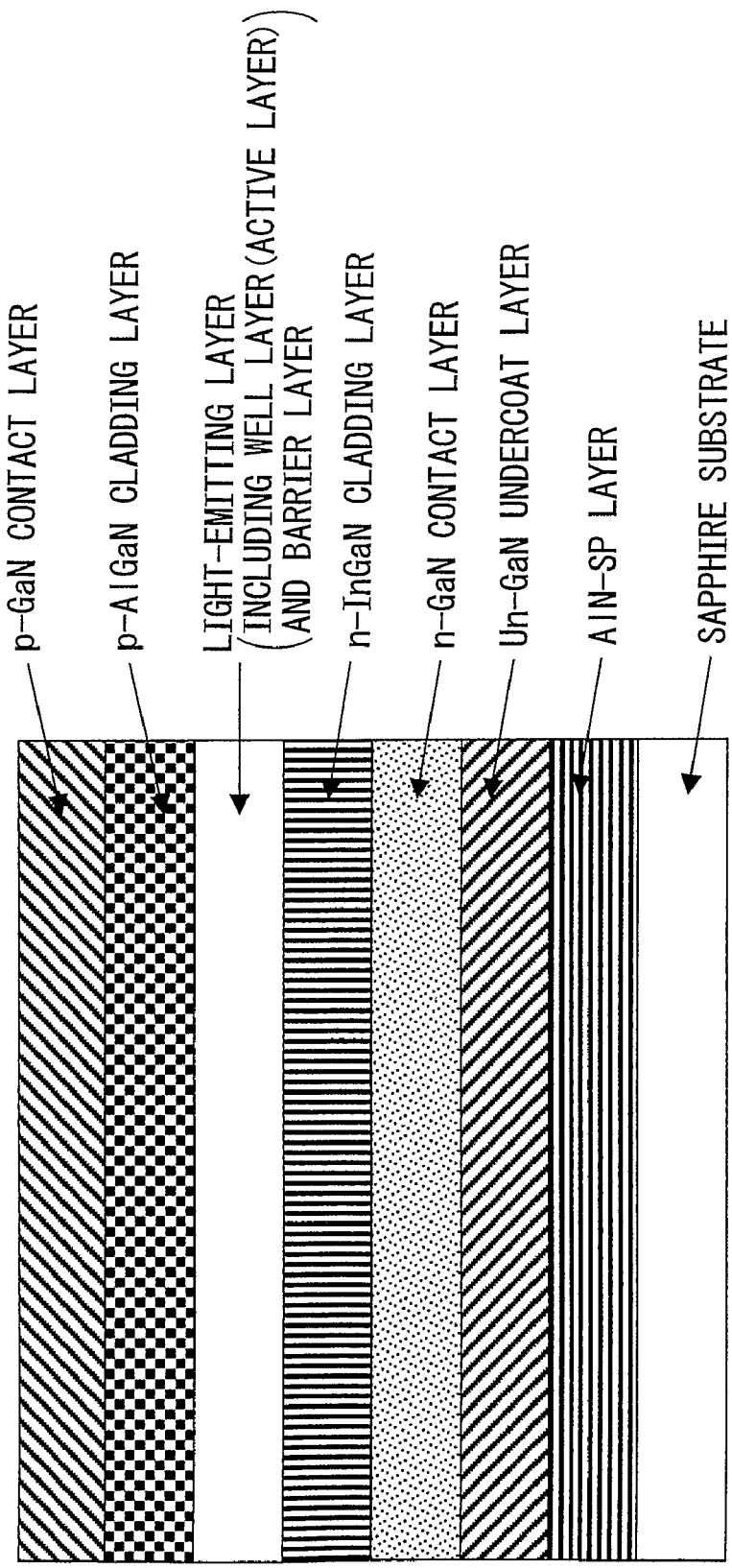
FIG. 3 is a schematic view of a cross-section of the gallium nitride compound semiconductor multilayer structure fabricated in Example 1.

FIG. 3 shows a gallium nitride compound semiconductor multilayer structure for producing a semiconductor light-emitting device which structure was fabricated in Example 1. As shown in FIG. 3, an SP layer formed of AlN is stacked on a sapphire substrate having a c-plane through a lattice-mismatch crystal epitaxial growth method. On the SP layer, the following layers are sequentially formed: an undoped GaN undercoat layer (thickness: 2 μm); a highly-Si-doped n-GaN contact layer (electron concentration: $1 \times 10^{19}$ cm$^{-3}$, thickness: 2 μm); an n-In$_{0.1}$Ga$_{0.9}$N cladding layer (electron concentration: $1 \times 10^{18}$ cm$^{-3}$, thickness: 125 Å); a light-emitting layer of a multiple quantum well structure including GaN barrier layers (6 layers, thickness of each layer: 160 Å) and well layers (active layers) (5 layers, each layer being formed undoped In$_{0.2}$Ga$_{0.8}$N layer (thickness: 25 Å) and a GaN layer (thickness: 0 to 5 Å)); an Mg-doped p-type Al$_{0.07}$Ga$_{0.93}$N cladding layer (thickness: 100 Å); and an Mg-doped p-GaN contact layer (hole concentration: $8 \times 10^{17}$ cm$^{-3}$, thickness: 0.1 μm).

The aforementioned gallium nitride compound semiconductor multilayer structure was fabricated by means of MOCVD through the following procedure.

Firstly, a sapphire substrate was placed in a stainless reactor furnace that can heat a plurality of substrates by means of a carbon susceptor heated using an induction heater. The susceptor has a mechanism such that the susceptor itself is rotatable and rotates the substrates. The sapphire substrate was placed on the carbon susceptor for heating, the operation being performed in a nitrogen-substituted glove box. After introduction of the substrate, the reactor furnace was purged with nitrogen.

After passing nitrogen for 8 minutes, the substrate temperature was elevated, over 10 minutes, to 600° C. by means of the induction heater, and the pressure inside the furnace was adjusted to 150 mbar (15 kPa). While the substrate temperature was maintained at 600° C., the substrate surface was thermally cleaned by allowing the substrate to stand for 2 minutes under a flow of hydrogen and nitrogen.

After completion of thermal cleaning, a valve of a nitrogen carrier gas feeding pipe was closed, and only hydrogen was supplied to the reactor furnace.

After the carrier gas was changed to hydrogen, the substrate temperature was elevated to 1,180° C. After confirmation that a constant temperature of 1,180° C. was attained, a gas containing TMAl vapor was supplied to the reactor furnace by opening the corresponding valve. The supplied TMAl was caused to react with N atoms which had been released through decomposition of deposits on an inner wall of the reactor furnace, thereby depositing AlN on the sapphire substrate.

After supply of TMAl for 8 minutes and 30 seconds, the valve was closed to stop supply of the gas containing TMAl vapor to the reactor furnace. The conditions were maintained for 4 minutes, whereby the TMAl vapor remaining in the furnace was completely removed. Subsequently, ammonia gas was supplied to the furnace by opening the corresponding valve.

Four minutes after the start of supply of ammonia gas, the susceptor temperature was lowered to 1,040° C. under ammonia flow. During lowering of the susceptor temperature, the flow rate of TMGa was regulated by means of a flow controller.

After confirmation that the susceptor temperature was lowered to 1,040° C. and the susceptor maintained a constant temperature of 1,040° C., TMGa was supplied into the furnace by opening the corresponding valve, so as to grow undoped GaN. The growth was performed for about one hour, thereby forming the aforementioned GaN layer.

Thus, an undoped GaN undercoat layer having a thickness of 2 μm was formed.

On the undoped GaN undercoat layer, a highly-Si-doped n-type GaN layer was grown. After completion of growth of the undoped GaN undercoat layer, the supply of TMGa into the furnace was interrupted for one minute, and the flow rate of SiH$_4$ was adjusted during the interruption of flow. The flow rate of interest had been predetermined in advance, and the flow was regulated so as to control the electron concentration of the highly-Si-doped GaN layer to $1 \times 10^{19}$ cm$^{-3}$. Ammonia was supplied continuously into the furnace, but the flow rate was unchanged. During the above interruption of TMGa supply for one minute, the susceptor temperature was elevated from 1,040° C. to 1,060° C.

After the interruption of TMGa supply for one minute, TMGa and SiH$_4$ were supplied, and the growth was performed for one hour, thereby forming a highly-Si-doped n-GaN contact layer having a thickness of 2 μm.

After growth of the highly-Si-doped n-GaN contact layer, supply of TMGa and SiH$_4$ into the furnace was stopped by closing the corresponding valves. The carrier gas was changed from hydrogen to nitrogen through valve operation, while ammonia was supplied continuously. Thereafter, the substrate temperature was lowered from 1,060° C. to 730° C.

During the lowering of the temperature inside the furnace, the flow rate of SiH$_4$ was modified. The flow rate of interest had been predetermined in advance, and the flow was regulated so as to control the electron concentration of the Si-doped n-InGaN cladding layer to $1 \times 10^{18}$ cm$^{-3}$. Ammonia was supplied continuously into the furnace, but the flow rate was unchanged.

Subsequently, after the conditions in the furnace had been stabilized, TMIn, TEGa, and SiH$_4$ were supplied to the furnace by simultaneously opening the corresponding valves. The supply was continued for a predetermined period of time, thereby forming an Si-doped n-In$_{0.1}$Ga$_{0.9}$N cladding layer having a thickness of 125 Å. Supply of the sources (TMIn, TEGa, and SiH$_4$) was stopped by closing the corresponding valves.

After completion of growth of the Si-doped n-In$_{0.1}$Ga$_{0.9}$N cladding layer, the susceptor temperature was elevated to 930° C. and the susceptor was held at a constant temperature of 930° C., TEGa was supplied to the furnace by opening the corresponding valve while substrate temperature, pressure inside the furnace, flow rate of ammonia and carrier gas, and the type of carrier gas were maintained constant. The growth was performed for a predetermined period of time at a susceptor temperature of 930° C. Subsequently, the susceptor temperature was lowered to 730° C., and TEGa was supplied so as to perform growth. The supply of TEGa was stopped by closing the corresponding valve, thereby terminating the growth of a GaN barrier layer. As a result, a GaN barrier layer having a total thickness of 160 Å was formed.

After completion of growth of the GaN barrier layer, supply of the Group III source was stopped for 30 seconds. Subsequently, TEGa and TMIn were supplied to the furnace by opening the corresponding valves while substrate temperature, pressure inside the furnace, flow rate of ammonia and carrier gas, and the type of carrier gas were maintained constant. TEGa and TMIn were supplied for a predetermined period of time, and supply of TMIn was stopped by closing the corresponding valve, thereby terminating the growth of an In$_{0.2}$Ga$_{0.8}$N well layer (active layer). In this instance, an In$_{0.2}$Ga$_{0.8}$N layer having a thickness of 25 Å was formed.

After completion of the growth of the In$_{0.2}$Ga$_{0.8}$N layer, only TEGa was supplied continuously to the furnace for a predetermined period of time, thereby forming, on the InGaN layer, a GaN thin layer (capping layer) for preventing the release of In. Then, supply of TEGa was stopped.

Subsequently, while N$_2$ serving as a carrier gas and NH$_3$ were supplied continuously, the susceptor temperature was elevated to 930° C. over two minutes. Through this operation, a portion of the In$_{0.2}$Ga$_{0.8}$N layer was decomposed and sublimated, thereby removing a portion of the In$_{0.2}$Ga$_{0.8}$N layer and reducing the thickness of the layer. Thus, a thin portion having a small thickness was formed in the well layer (active layer).

The aforementioned procedure was repeated five times, to thereby form five GaN barrier layers and five In$_{0.2}$Ga$_{0.8}$N well layers. Finally, another GaN barrier was formed, to thereby fabricate a light-emitting layer having a multiple quantum well structure.

On the outermost GaN barrier layer of the light-emitting layer, an Mg-doped p-type Al$_{0.07}$Ga$_{0.93}$N cladding layer was formed.

After completion of the growth of the last GaN barrier layer by stopping the supply of TEGa, the substrate temperature was elevated to 1,020° C. The carrier gas was changed to hydrogen, and the pressure inside the furnace was adjusted to 150 mbar (15 kPa). After the pressure inside the furnace became constant, sources (TMGa, TMAl, and Cp$_2$Mg) were supplied to the furnace by opening the corresponding valves. The growth was performed for about three minutes, after which supply of TEGa and TMAl was stopped, thereby terminating the growth of an Mg-doped p-type Al$_{0.07}$Ga$_{0.93}$N cladding layer. As a result, an Mg-doped p-type Al$_{0.07}$Ga$_{0.93}$N cladding layer having a thickness of 100 Å was formed.

On the Mg-doped p-type Al$_{0.07}$Ga$_{0.93}$N cladding layer, an Mg-doped p-type GaN contact layer was formed.

After completion of the growth of the Mg-doped p-Al$_{0.07}$Ga$_{0.93}$N cladding layer by stopping the supply of TMGa, TMAl, and Cp$_2$Mg, the pressure inside the furnace was adjusted to 200 mbar (20 kPa). After the pressure inside the furnace became constant, sources (TMGa and Cp$_2$Mg) were supplied to the furnace by opening the corresponding valves. The flow rate of Cp$_2$Mg had been predetermined in advance, and the flow was regulated so as to control the hole concentration of the Mg-doped p-GaN contact layer to $8 \times 10^{17}$ cm$^{-3}$. Thereafter, the growth was performed for about four minutes, after which supply of TMGa and Cp$_2$Mg was stopped, thereby terminating the growth of the Mg-doped GaN layer. As a result, the Mg-doped p-GaN contact layer was formed to a thickness of 0.1 µm.

After completion of the growth of the Mg-doped p-GaN contact layer, the electricity supply to the induction heater was stopped, and the substrate temperature was lowered to room temperature over 20 minutes. During the process of lowering the temperature, the atmosphere in the reactor furnace was exclusively nitrogen. When the substrate temperature was confirmed to have been lowered to room temperature, the thus-fabricated gallium nitride compound semiconductor multilayer structure was removed to the atmosphere.

Through the above-described procedure, the gallium nitride compound semiconductor multilayer structure for producing a semiconductor light-emitting device was fabricated. Even though the Mg-doped GaN layer had not undergone annealing for activating the p-type carrier, the GaN layer exhibited p-type conductivity.

By use of the aforementioned gallium nitride compound semiconductor multilayer structure, a light-emitting diode, a type of semiconductor light-emitting device, was fabricated.

On the surface of the p-type GaN contact layer of the thus-fabricated gallium nitride compound semiconductor multilayer structure, there was formed a reflection-type positive electrode having a structure in which Pt, Rh, and Au were successively formed on the contact layer side through a conventional photolithographic method.

Figure 4:
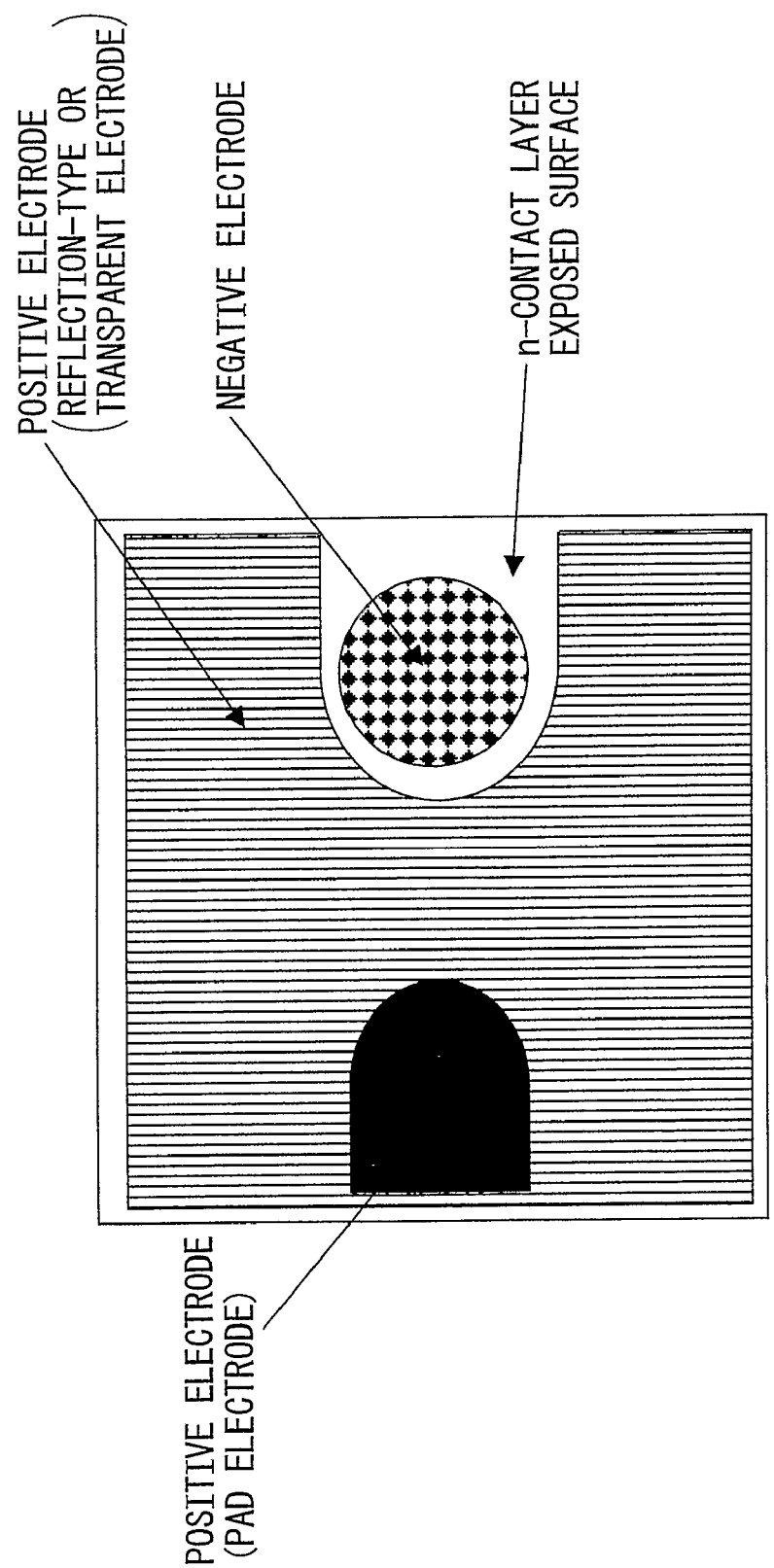
FIG. 4 is a schematic view of an electrode configuration of the light-emitting diode fabricated in Example 1 and 2.

Subsequently, the aforementioned gallium nitride compound semiconductor multilayer structure was dry-etched so as to expose a negative electrode portion of the highly-Si-doped n-type GaN contact layer. Ti and Al were successively formed on the exposed portion of the contact layer, thereby forming a negative electrode. Through these operations, electrodes of the shape shown in FIG. 4 were fabricated.

The back of the sapphire substrate of the gallium nitride compound semiconductor multilayer structure which had been provided with the positive electrode and the negative electrode in the above manner was ground and polished, thereby providing a mirror surface. Subsequently, the gallium nitride compound semiconductor multilayer structure was cut into square (350 µm×350 µm) chips, and each chip was affixed on a sub-mount such that the electrodes were in contact with the sub-mount. The thus-formed sub-mounted chip was placed on a lead frame and wired to the lead frame with gold wire, thereby fabricating a light-emitting device.

When an operating current was applied to the positive electrode and the negative electrode of the thus-fabricated light-emitting diode in a forward direction, the diode exhibited a forward voltage of 3.0 V at a current of 20 mA, an emission wavelength of 455 nm, and an emission output of 10 mW. Such characteristics of the light-emitting diode can be attained without variation among light-emitting diodes cut and produced from virtually the entirety of the above-fabricated gallium nitride compound semiconductor multilayer structure.

The thus-fabricated gallium nitride compound semiconductor multilayer structure was observed under a cross-section TEM, and FIGS. 1 and 2 show photographs thereof (magnification: 2,000,000 (FIG. 1) and 500,000 (FIG. 2)).

As shown in FIGS. 1 and 2, each well layer serving as an active layer is identified as being formed of a thick portion and a thin portion.

The observed thick portion was found to have a thickness of 25 Å and a width of 500 Å, and the observed thin portion was found to have a width of 50 Å and a thickness of 10 Å or less. It was observed that some portions of the well layer were completely removed.

From the TEM cross-section photographs, the area of the thick portion was found to account for 90% to 60% of the entire area of the active layer.

The barrier layers were found to have a thickness of 160 Å. Each barrier layer leveled the surface of each well layer having a thin portion and a thick portion, and each well layer was found to have a flat bottom surface. The difference in thickness between the thick portion and the thin portion is predominantly attributable to depressions and protrusions formed on the upper surface of each well layer.

Comparative Example 1

In Comparative Example 1, the procedure of Example 1 was repeated, except that a different light-emitting layer was employed, to thereby fabricate a gallium nitride compound semiconductor multilayer structure of the same configuration. The light-emitting layer of Comparative Example 1 is different from that of Example 1 in that the a well layer (active layer) having a uniform thickness and a barrier layer having a uniform thickness were repeatedly stacked.

The procedure of Comparative Example 1 for fabricating a gallium nitride compound semiconductor multilayer structure was different from that of Example 1 in the following. Specifically, in Example 1, after formation of a capping layer (GaN thin layer) of the well layer, supply of TEGa was stopped, and the temperature was elevated from 730° C. to 930° C. over two minutes. Then, a barrier layer was formed. However, in Comparative Example 1, after formation of a GaN thin layer (capping layer) of the well layer, the temperature was elevated from 730° C. to 930° C. over two minutes while TEGa was supplied continuously. Then, a barrier layer was formed at 930° C.

In a manner similar to that of Example 1, the light-emitting diode was fabricated from the gallium nitride compound semiconductor multilayer structure and was evaluated. As a result, the diode exhibited a forward voltage of 3.9 V at a current of 20 mA, an emission wavelength of 455 nm, and an emission output of 8.5 mW.

Figure 5:
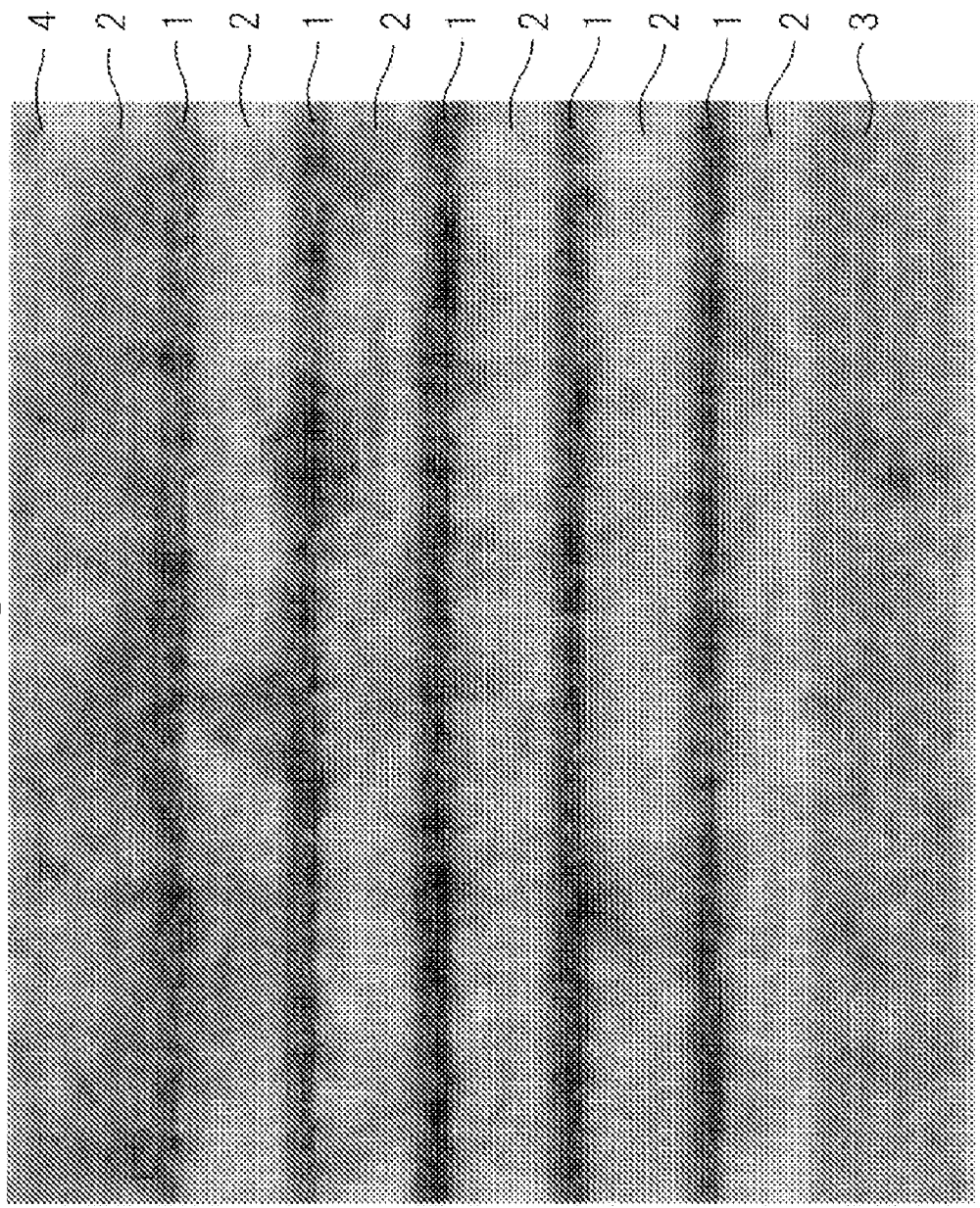
FIG. 5 is an exemplary cross-section TEM photograph of the gallium nitride compound semiconductor multilayer structure fabricated in Comparative Example 1.
Figure 6:
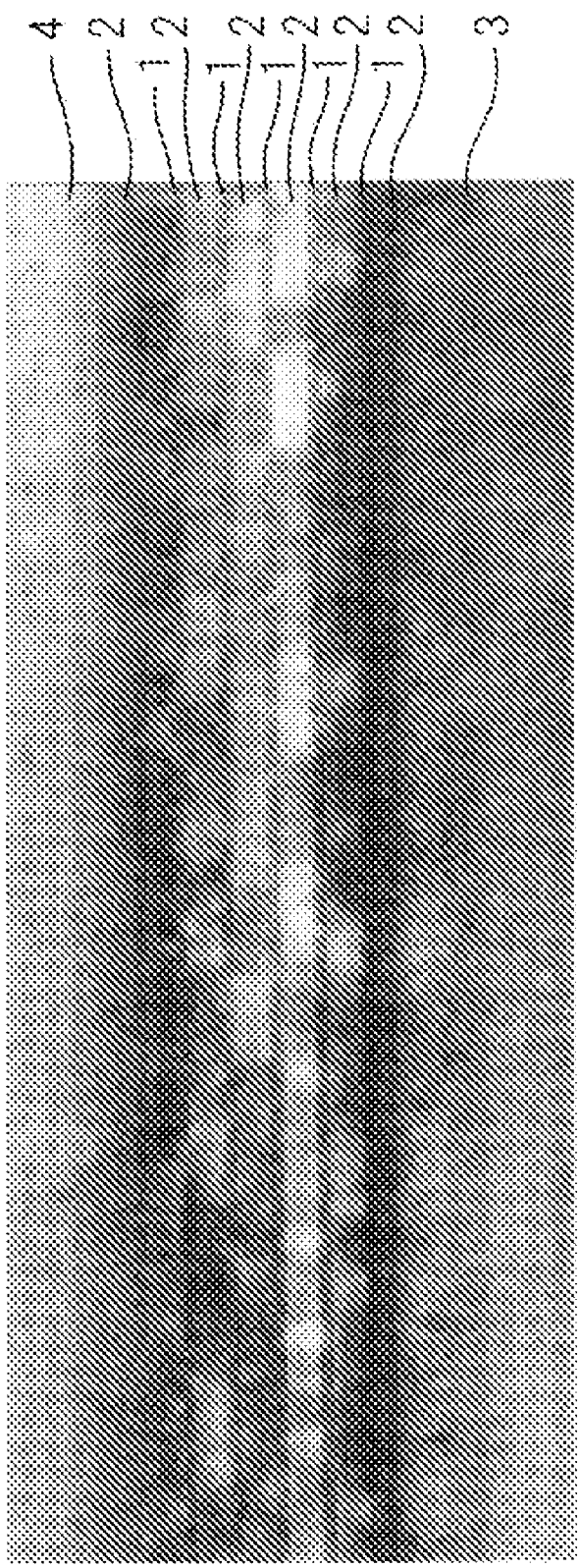
FIG. 6 is another exemplary cross-section TEM photograph of the gallium nitride compound semiconductor multilayer structure fabricated in Comparative Example 1.

The thus-fabricated gallium nitride compound semiconductor multilayer structure was observed under a cross-section TEM, and FIGS. 5 and 6 show photographs thereof (magnification: 2,000,000 (FIG. 5) and 500,000 (FIG. 6)). As shown in FIGS. 5 and 6, each well layer (active layer) has a virtually uniform thickness of about 25 Å, and no position-dependent variation in thickness was found.

Example 2

In this example, a gallium nitride compound semiconductor multilayer structure was fabricated as follows.

An SP layer formed of AlN is stacked on a sapphire substrate having a c-plane through a lattice-mismatch crystal epitaxial growth method. On the SP layer, the following layers are sequentially formed: an undoped GaN undercoat layer (thickness: 8 μm); a n-GaN contact layer in which a highly-Ge-doped layer and a slightly-Ge-doped layer is alternately stacked 100 times (average electron concentration: $5 \times 10^{18}$ cm$^{-3}$, thickness: 4 μm); an n-$In_{0.1}Ga_{0.9}N$ cladding layer (electron concentration: $1 \times 10^{18}$ cm$^{-3}$, thickness: 180 Å); a light-emitting layer of a multiple quantum well structure including GaN barrier layers (6 layers, thickness of each layer: 160 Å) and well layers (active layers) (5 layers, each layer being formed undoped $In_{0.2}Ga_{0.8}N$ layer (thickness: 25 Å) and a GaN layer (thickness: 0 to 5 Å)); an Mg-doped p-type $Al_{0.07}Ga_{0.93}N$ cladding layer (thickness: 100 Å); and an Mg-doped p-GaN contact layer (hole concentration: $8 \times 10^{17}$ cm$^{-3}$, thickness: 0.1 μm).

The aforementioned gallium nitride compound semiconductor multilayer structure was fabricated by means of MOCVD through the procedure similar to that of Example 1.

Next, by use of the aforementioned gallium nitride compound semiconductor multilayer structure, a light-emitting diode, a type of semiconductor light-emitting device, was fabricated through the following procedure.

On the surface of the p-type GaN contact layer of the thus-fabricated gallium nitride compound semiconductor multilayer structure, there was formed a transparent-type positive electrode having a structure in which Pt and Au were successively formed on the contact layer side, through a conventional photolithographic method. Then, on the positive electrode, there was formed a pad electrode having a structure in which Ti, Au, Al and Au were successively formed on the positive electrode side Subsequently, the gallium nitride compound semiconductor multilayer structure was dry-etched so as to expose a negative electrode portion of the n-type GaN contact layer. Ti and Al were successively formed on the exposed portion of the contact layer, thereby forming a negative electrode. Through these operations, electrodes of a shape shown in FIG. 4 were fabricated.

The back of the sapphire substrate of the gallium nitride compound semiconductor multilayer structure, which had been provided with the positive electrode and the negative electrode in the above manner, was ground and polished, thereby providing a mirror surface. Subsequently, the gallium nitride compound semiconductor multilayer structure was cut into square (350 μm×350 μm) chips. The thus-formed chip was placed on a lead frame and wired to the lead frame with gold wire, thereby fabricating a light-emitting device.

When an operation current was applied to the positive electrode and the negative electrode of the thus-fabricated light-emitting diode in a forward direction, the diode exhibited a forward voltage of 3.2 V at a current of 20 mA, an emission wavelength of 470 nm, and an emission output of 6 mW. Such characteristics of the light-emitting diode can be attained without variation among light-emitting diodes cut and produced from virtually the entirety of the above-fabricated gallium nitride compound semiconductor multilayer structure.

Comparative Example 2

In Comparative Example 2, a light-emitting diode having the same electrode structure as employed in the diode of Example 2 was fabricated by use of the gallium nitride compound semiconductor multilayer structure fabricated in Comparative Example 1.

In a manner similar to that of Example 2, the fabricated light-emitting diode was evaluated. As a result, the diode exhibited a forward voltage of 3.9 V at a current of 20 mA, an emission wavelength of 455 nm, and an emission output of 5 mW.

INDUSTRIAL APPLICABILITY

The light-emitting device produced from the gallium nitride compound semiconductor multilayer structure of the present invention operates at low voltage while maintaining satisfactory light emission output. Thus, the present invention is of remarkably great value in industry.

The invention claimed is:

1. A gallium nitride compound semiconductor multilayer structure comprising a substrate, and an n-type layer, an active layer, and a p-type layer formed on the substrate, a negative electrode and a positive electrode being provided on the n-type layer and the p-type layer, respectively, the active layer being sandwiched by the n-type layer and the p-type layer, the active layer is a single quantum well structure formed of a single well layer or comprises at least one well layer in a multiple quantum well structure, the active layer comprising a thick portion and a thin portion, and the thick portion being disposed irregularly within a single well layer, wherein the active layer has a flat lower surface (on the substrate side) and an uneven upper surface so as to form the thick portion and the thin portion.

2. The gallium nitride compound semiconductor multilayer structure according to claim 1, wherein the active layer contains In.

3. The gallium nitride compound semiconductor multilayer structure according to claim 2, wherein the upper surface of the active layer is covered with a thin layer not containing In.

4. The gallium nitride compound semiconductor multilayer structure according to claim 1, wherein the thick portion has a thickness of 15 Å to 50 Å.

5. The gallium nitride compound semiconductor multilayer structure according to claim 4, wherein the thick portion has a thickness of 15 Å to 30 Å.

6. The gallium nitride compound semiconductor multilayer structure according to claim 1, wherein the thick portion has an arithmetic mean width, as measured in a cross-section of the multilayer structure, of 10 nm or more.

7. The gallium nitride compound semiconductor multilayer structure according to claim 6, wherein the thick portion has a width, as measured in a cross-section of the multilayer structure, of 100 nm or more.

8. The gallium nitride compound semiconductor multilayer structure according to claim 1, wherein the thin portion has a thickness of 15 Å or less.

9. The gallium nitride compound semiconductor multilayer structure according to claim 1, wherein the thin portion has an arithmetic mean width, as measured in a cross-section of the multilayer structure, of 100 nm or less.

10. The gallium nitride compound semiconductor multilayer structure according to claim 9, wherein the thin portion has a width, as measured in a cross-section of the multilayer structure, of 50 nm or less.

11. The gallium nitride compound semiconductor multilayer structure according to claim 1, wherein the difference in thickness between the thick portion and the thin portion falls within a range of 10 Å to 30 Å.

12. The gallium nitride compound semiconductor multilayer structure according to claim 1, wherein the thick portion has an area accounting for 30% or more the entire area of the active layer.

13. The gallium nitride compound semiconductor multilayer structure according to claim 12, wherein the thick portion has an area accounting for 50% or more the entire area of the active layer.

14. The gallium nitride compound semiconductor multilayer structure according to claim 1, wherein the active layer is at least one well layer in a multiple quantum well structure.

15. The gallium nitride compound semiconductor multilayer structure according to claim 14, wherein the multiple quantum well structure is repeatedly stacked 3 to 10 times.

16. The gallium nitride compound semiconductor multilayer structure according to claim 15, wherein the multiple quantum well structure is repeatedly stacked 3 to 6 times.

17. The gallium nitride compound semiconductor multilayer structure according to claim 14, wherein the multiple quantum well structure has a barrier layer formed of a gallium nitride compound semiconductor selected from GaN, AlGaN, and InGaN which has an In content lower than that of the InGaN forming the active layer.

18. The gallium nitride compound semiconductor multilayer structure according to claim 17, wherein the barrier layer is formed of GaN.

19. The gallium nitride compound semiconductor multilayer structure according to claim 17, wherein the barrier layer has a thickness of 70 Å to 500 Å.

20. The gallium nitride compound semiconductor multilayer structure according to claim 19, wherein the barrier layer has a thickness of 160 Å or more.

21. The gallium nitride compound semiconductor light-emitting device, wherein the device has a negative electrode and a positive electrode, the negative electrode and the positive electrode being provided on the n-type layer and the p-type layer of a gallium nitride compound semiconductor multilayer structure according to claim 1, respectively.

22. The gallium nitride compound semiconductor light-emitting device according to claim 21, which has a flip-chip-type device structure.

23. The gallium nitride compound semiconductor light-emitting device according to claim 22, wherein the positive electrode has a reflection-type structure.

24. A method for producing a gallium nitride compound semiconductor multilayer structure comprising a substrate, and an n-type layer, an active layer, and a p-type layer formed on the substrate, a negative electrode and a positive electrode being provided on the n-type layer and the p-type layer, respectively, the active layer being sandwiched by the n-type layer and the p-type layer, the active layer is a single quantum well structure formed of a single well layer or comprises at least one well layer in a multiple quantum well structure, the active layer comprising a thick portion and a thin portion, and the thick portion being disposed irregularly within a single well layer, wherein the active layer has a flat lower surface (on the substrate side) and an uneven upper surface so as to form the thick portion and the thin portion, wherein the method comprises a step of forming the active layer, which step includes a step of growing a gallium nitride compound semiconductor and a step of decomposing or sublimating a portion of the gallium nitride compound semiconductor.

25. The method for producing a gallium nitride compound semiconductor multilayer structure according to claim 24, wherein the active layer contains In.

26. The method for producing a gallium nitride compound semiconductor multilayer structure according to claim 25, wherein the active layer is grown by continuously supplying a nitrogen source and a Group III metal source containing In and Ga and, subsequently, a thin layer not containing In is formed on a surface of the active layer by stopping the feeding of the In metal source.

27. The method for producing a gallium nitride compound semiconductor multilayer structure according to claim 24, wherein the step of growing is performed at a substrate temperature of T1 and the step of decomposing or sublimating is performed at a substrate temperature of T2, wherein T1 and T2 satisfy the relationship: T1≦T2.

28. The method for producing a gallium nitride compound semiconductor multilayer structure according to claim 27, wherein T1 falls within a range of 650 to 900° C.

29. The method for producing a gallium nitride compound semiconductor multilayer structure according to claim 28, wherein T2 falls within a range of 700 to 1,000° C.

30. The method for producing a gallium nitride compound semiconductor multilayer structure according to claim 24, wherein the step of growing is performed in an atmosphere containing a nitrogen source and a Group III metal source and the step of decomposing or sublimating is performed in an atmosphere containing a nitrogen source but not containing a Group III metal source.

31. The method for producing a gallium nitride compound semiconductor multilayer structure according to claim 30, wherein the step of decomposing or sublimating is performed while the substrate temperature T1 is elevated to T2.

32. The method for producing a gallium nitride compound semiconductor multilayer structure according to claim 31, wherein the substrate temperature T1 is elevated to T2 at a temperature elevation rate of 1° C./min to 100° C./min.

33. The method for producing a gallium nitride compound semiconductor multilayer structure according to claim 32, wherein the temperature elevation rate is 5° C./min to 50° C./min.

34. The method for producing a gallium nitride compound semiconductor multilayer structure according to claim 31, wherein the substrate temperature T1 is elevated to T2 over 30 seconds to 10 minutes.

35. The method for producing a gallium nitride compound semiconductor multilayer structure according to claim 34, wherein the substrate temperature T1 is elevated to T2 over one minute to five minutes.

36. The method for producing a gallium nitride compound semiconductor multilayer structure according to claim 27, wherein the active layer is at least one well layer in a multiple quantum well structure, and at least one barrier layer in the multiple quantum well structure is grown at T2, followed by lowering the substrate temperature to T3 at which further growth is performed.

37. The method for producing a gallium nitride compound semiconductor multilayer structure according to claim 36, wherein T3 is equal to T1.

* * * * *